(12) United States Patent  (10) Patent No.: US 7,400,506 B2
Hoss et al.  (45) Date of Patent: Jul. 15, 2008

(54) METHOD AND APPARATUS FOR COOLING A MEMORY DEVICE

(75) Inventors: Shawn P. Hoss, Round Rock, TX (US); Paul T. Artman, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 92 days.

(21) Appl. No.: 11/484,458

(22) Filed: Jul. 11, 2006

(65) Prior Publication Data

US 2008/0013282 A1 Jan. 17, 2008

(51) Int. Cl.
*H05K 7/20* (2006.01)
*H01L 23/36* (2006.01)

(52) U.S. Cl. .................. 361/715; 361/704; 361/710; 361/719; 361/721; 165/80.3; 165/104.33; 165/185; 257/717; 257/718; 174/16.3; 174/252

(58) Field of Classification Search .......... 361/704, 361/700–702, 707, 710, 714–717, 719–724, 361/752, 753, 756, 802, 818; 174/16.3, 252, 174/15.1; 165/80.2, 80.3, 104.33, 185; 257/706–727; 29/835, 840, 842
See application file for complete search history.

(56) References Cited

U.S. PATENT DOCUMENTS

| 5,109,318 | A | * | 4/1992 | Funari et al. ............... 361/710 |
| 6,058,012 | A | * | 5/2000 | Cooper et al. .............. 361/704 |
| 6,119,765 | A | * | 9/2000 | Lee ........................... 165/80.3 |
| 6,130,820 | A | | 10/2000 | Konstad et al. |
| 6,233,150 | B1 | * | 5/2001 | Lin et al. .................... 361/704 |
| 6,353,538 | B1 | * | 3/2002 | Ali et al. ..................... 361/728 |
| 6,377,460 | B1 | * | 4/2002 | Pohl et al. .................. 361/704 |
| 6,424,532 | B2 | | 7/2002 | Kawamura |
| 6,449,156 | B1 | * | 9/2002 | Han et al. ................... 361/704 |
| 6,765,797 | B2 | * | 7/2004 | Summers et al. ........... 361/704 |
| 7,019,974 | B2 | | 3/2006 | Lee et al. |
| 7,023,700 | B2 | * | 4/2006 | Chiou et al. ................ 361/704 |
| 7,079,396 | B2 | * | 7/2006 | Gates et al. ................. 361/719 |
| 7,106,595 | B2 | * | 9/2006 | Foster et al. ............... 361/721 |
| 7,151,668 | B1 | * | 12/2006 | Stathakis .................... 361/700 |
| 7,221,569 | B2 | * | 5/2007 | Tsai ............................ 361/704 |

* cited by examiner

*Primary Examiner*—Michael V Datskovskiy
(74) *Attorney, Agent, or Firm*—Haynes and Boone, LLP

(57) ABSTRACT

A memory device cooling apparatus includes a first heat sink operable to engage a first chip that is located on a memory device and that is operable to operate at a first temperature. A second heat sink is included that is separate from the first heat sink and is operable to engage a second chip that is located on a memory device and that is operable to operate at a second temperature, wherein the second temperature is different from the first temperature. A retaining feature is operable to couple the first heat sink and the second heat sink to a memory device. The memory device cooling apparatus may be coupled to a memory device having at least two different chips that operate at different temperatures to efficiently dissipate heat from the chips in order to cool the memory device.

16 Claims, 9 Drawing Sheets

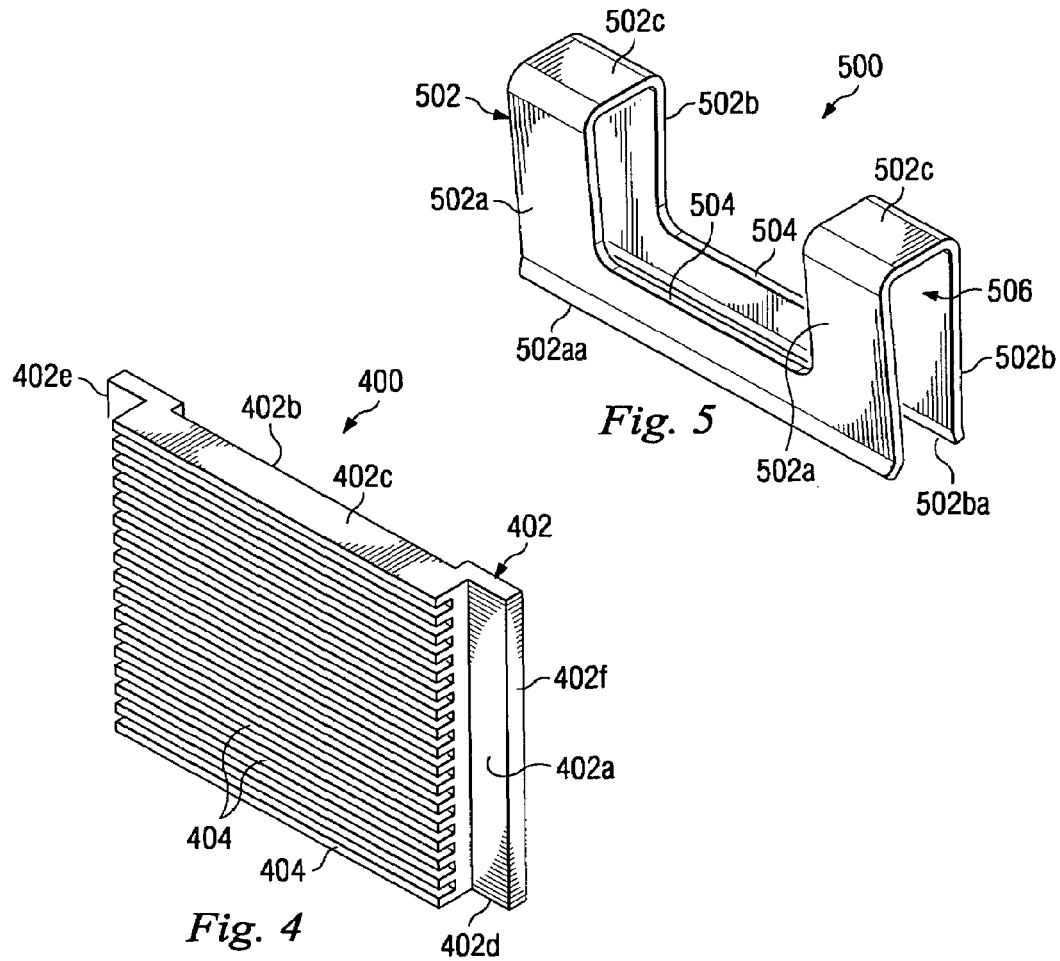
*Fig. 5*
*Fig. 4*
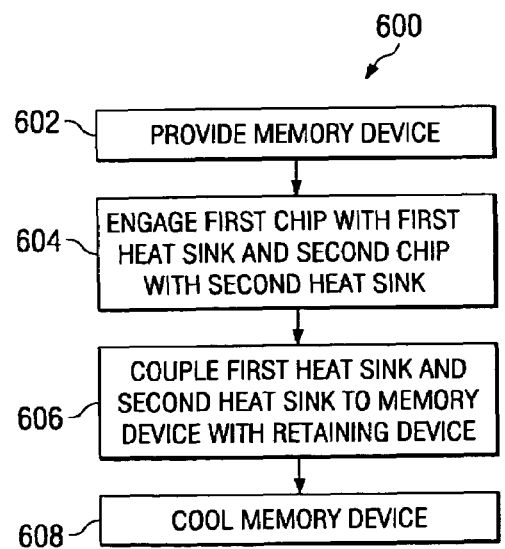
*Fig. 6a*

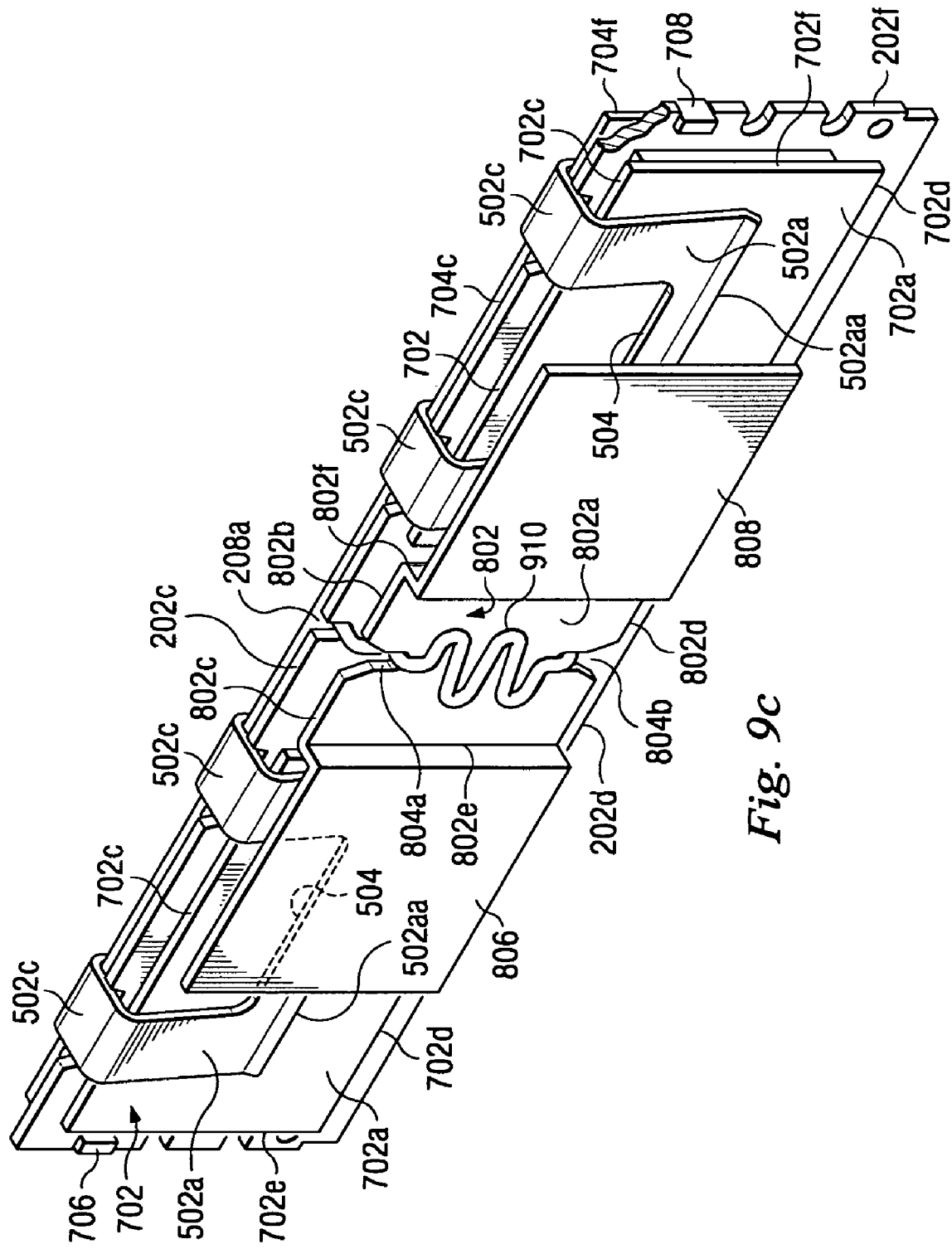

METHOD AND APPARATUS FOR COOLING A MEMORY DEVICE

BACKGROUND

The present disclosure relates generally to information handling systems, and more particularly to cooling a memory device in an information handling system.

As the value and use of information continues to increase, individuals and businesses seek additional ways to process and store information. One option is an information handling system (IHS). An IHS generally processes, compiles, stores, and/or communicates information or data for business, personal, or other purposes. Because technology and information handling needs and requirements may vary between different applications, IHSs may also vary regarding what information is handled, how the information is handled, how much information is processed, stored, or communicated, and how quickly and efficiently the information may be processed, stored, or communicated. The variations in IHSs allow for IHSs to be general or configured for a specific user or specific use such as financial transaction processing, airline reservations, enterprise data storage, or global communications. In addition, IHSs may include a variety of hardware and software components that may be configured to process, store, and communicate information and may include one or more computer systems, data storage systems, and networking systems.

Most IHSs include memory devices that provides a processor with fast storage to facilitate the execution of computer programs. These memory devices include memory chips that heat up when the memory device is operated. The cooling of these memory devices raises a number of issues.

In some memory devices such as, for example, Fully Buffered Dual In-line Memory Modules (FBDIMMs), memory chips such as, for example, Advanced Memory Buffer (AMB) chips and Dynamic Random Access Memory (DRAM) chips, are used to accomplish the memory device functions. As the power of the AMB chips increases, the difference in operating temperatures between the DRAM chips and the AMB chips also increases.

A conventional method to cool the chips involves coupling a heat sink to the AMB chip and letting the DRAM chip dissipate its own heat. However, some solutions require additional cooling for the DRAM chips. In that situation, a heat sink plate may be coupled to the memory device that engages both the DRAM chips and the AMB chip. Such solutions are inefficient as the temperature difference between the AMB chip and the DRAM chip does not allow for optimal dissipation of heat for each of the chips with the heat sink plate engaging both the AMB chip and the DRAM chips.

Accordingly, it would be desirable to provide for cooling a memory device absent the disadvantages found in the prior methods discussed above.

SUMMARY

According to one embodiment, a memory device cooling apparatus includes a first heat sink operable to engage a first chip that is located on a memory device and that is operable to operate at a first temperature, a second heat sink that is separate from the first heat sink and is operable to engage a second chip that is located on a memory device and that is operable to operate at a second temperature, wherein the second temperature is different from the first temperature, and a retaining feature operable to couple the first heat sink and the second heat sink to a memory device.

BRIEF DESCRIPTION OF THE DRAWINGS

FIG. 4 is a perspective view illustrating an embodiment of a second heat sink used with the memory device of FIG. 2 and the first heat sink of FIG. 3.

FIG. 5 is a perspective view illustrating an embodiment of a first retaining member used with the memory device of FIG. 2, the first heat sink of FIG. 3, and the second heat sink of FIG. 4.

FIG. 6a is a flow chart illustrating an embodiment of method for cooling a memory device.

FIG. 9c is a perspective view illustrating an embodiment of a memory device cooling apparatus including the first heat sink of FIGS. 7a and 7b, the second heat sink of FIG. 8, and the retaining member of FIG. 5 coupled to the memory device of FIG. 2.

DETAILED DESCRIPTION

For purposes of this disclosure, an IHS may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an IHS may be a personal computer, a PDA, a consumer electronic device, a network server or storage device, a switch router or other network communication device, or any other suitable device and may vary in size, shape, performance, functionality, and price. The IHS may include memory, one or more processing resources such as a central processing unit (CPU) or hardware or software control logic. Additional components of the IHS may include one or more storage devices, one or more communications ports for communicating with external devices as well as various input and output (I/O) devices, such as a keyboard, a mouse, and a video display. The IHS may also include one or more buses operable to transmit communications between the various hardware components.

Figure 1:
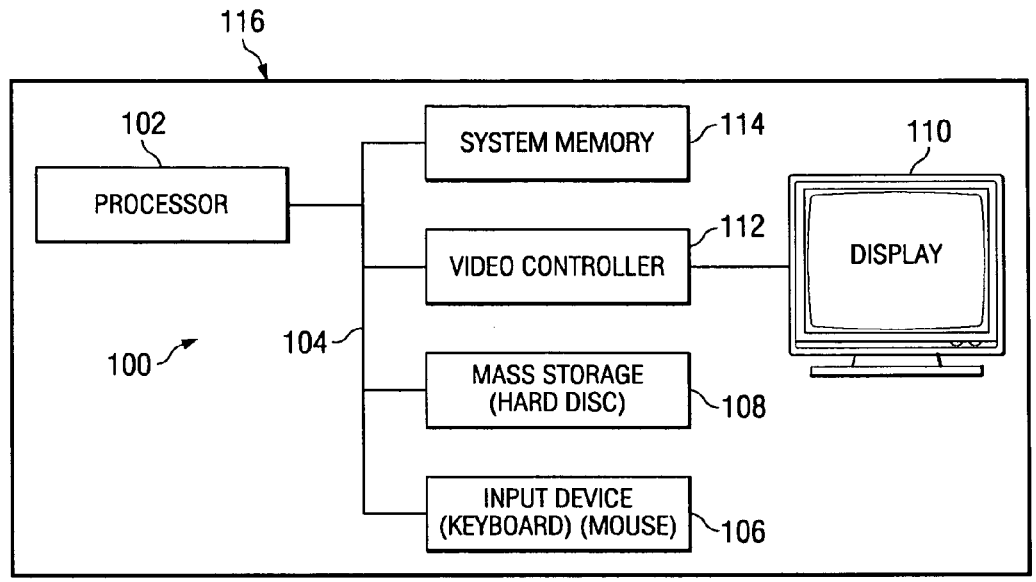
FIG. 1 is a schematic view illustrating an embodiment of an IHS.

In one embodiment, IHS 100, FIG. 1, includes a processor 102, which is connected to a bus 104. Bus 104 serves as a connection between processor 102 and other components of computer system 100. An input device 106 is coupled to processor 102 to provide input to processor 102. Examples of input devices include keyboards, touchscreens, and pointing devices such as mouses, trackballs and trackpads. Programs and data are stored on a mass storage device 108, which is coupled to processor 102. Mass storage devices include such devices as hard disks, optical disks, magneto-optical drives, floppy drives and the like. IHS system 100 further includes a display 110, which is coupled to processor 102 by a video controller 112. A system memory 114 is coupled to processor 102 to provide the processor with fast storage to facilitate execution of computer programs by processor 102. In an embodiment, a chassis 116 houses some or all of the components of IHS 100. It should be understood that other buses and intermediate circuits can be deployed between the components described above and processor 102 to facilitate interconnection between the components and the processor 102.

Figure 2:
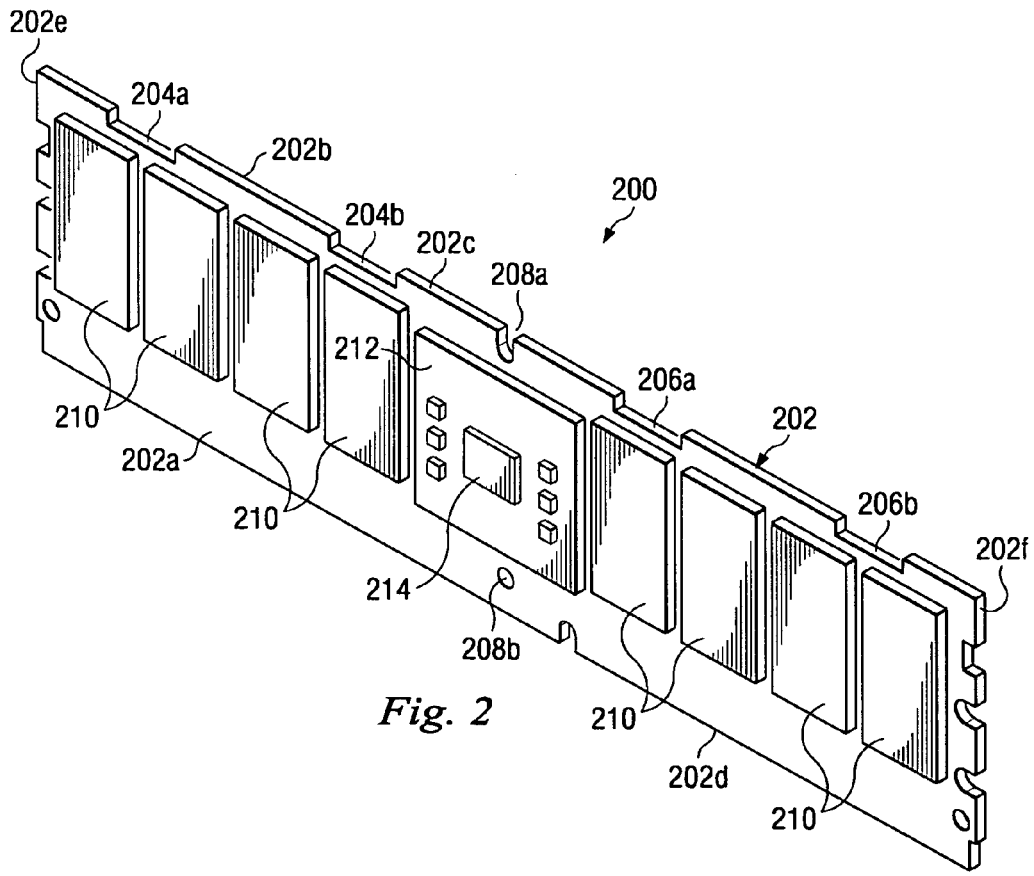
FIG. 2 is a perspective view illustrating an embodiment of a memory device.

Referring now to FIG. 2, a memory device 200 is illustrated. In an embodiment, the memory device 200 may be, for example, the system memory 114 described above with reference to FIG. 1. The memory device 200 includes a base 202 having a front surface 202a, a rear surface 202b located opposite the front surface 202a, a top edge 202c extending between the front surface 202a and the rear surface 202b, a bottom edge 202d located opposite the top edge 202c and extending between the front surface 202a and the rear surface 202b, and a pair of opposing side edges 202e and 202f extending between the front surface 202a, the rear surface 202b, the top edge 202c, and the bottom edge 202d. A plurality of first retaining member channels 204a and 204b are defined by the base 202a and located in a spaced apart orientation adjacent the top edge 202c of the base 202, with the first retaining member channel 204a also located adjacent the side edge 202e. A plurality of first retaining member channels 206a and 206b are defined by the base 202a and located in a spaced apart orientation adjacent the top edge 202c of the base 202, with the first retaining member channel 206b also located adjacent the side edge 202f. A second retaining member channel 208a is defined by the base 202 and located substantially centrally on the base 202a and adjacent the top edge 202c. A second retaining member aperture 208b is defined by the base 202 and located substantially centrally on the base 202 and adjacent the bottom edge 202d. A plurality of first chips 210 are coupled to and extend from the front surface 202a of the base 202 and are located along the length of the base 202 with the exception of the center of the base 202. In an embodiment, a plurality of first chips 210 may also be coupled to and extend from the rear surface 202b of the base 202 (not shown). In an embodiment, the first chips 210 may be a variety of chips known in the art such as, for example, DRAM chips. In an embodiment, the first chips 210 are operable to operate at a temperature of approximately 85 degrees Celsius. In an embodiment, the first chips 210 are operable to operate in a temperature range of approximately 85-95 degrees Celsius. A second chip 212 is coupled to and extends from the front surface 202a of the base 202 and is located substantially centrally on the base 202 between the plurality of first chips 210. In an embodiment, the second chip 212 may be a variety of chips known in the art such as, for example, an AMB chip. In an embodiment, the second chip 212 is operable to operate at a temperature of approximately 110 degrees Celsius. A heat transfer member 214 extends from the second chip 212.

Figure 3:
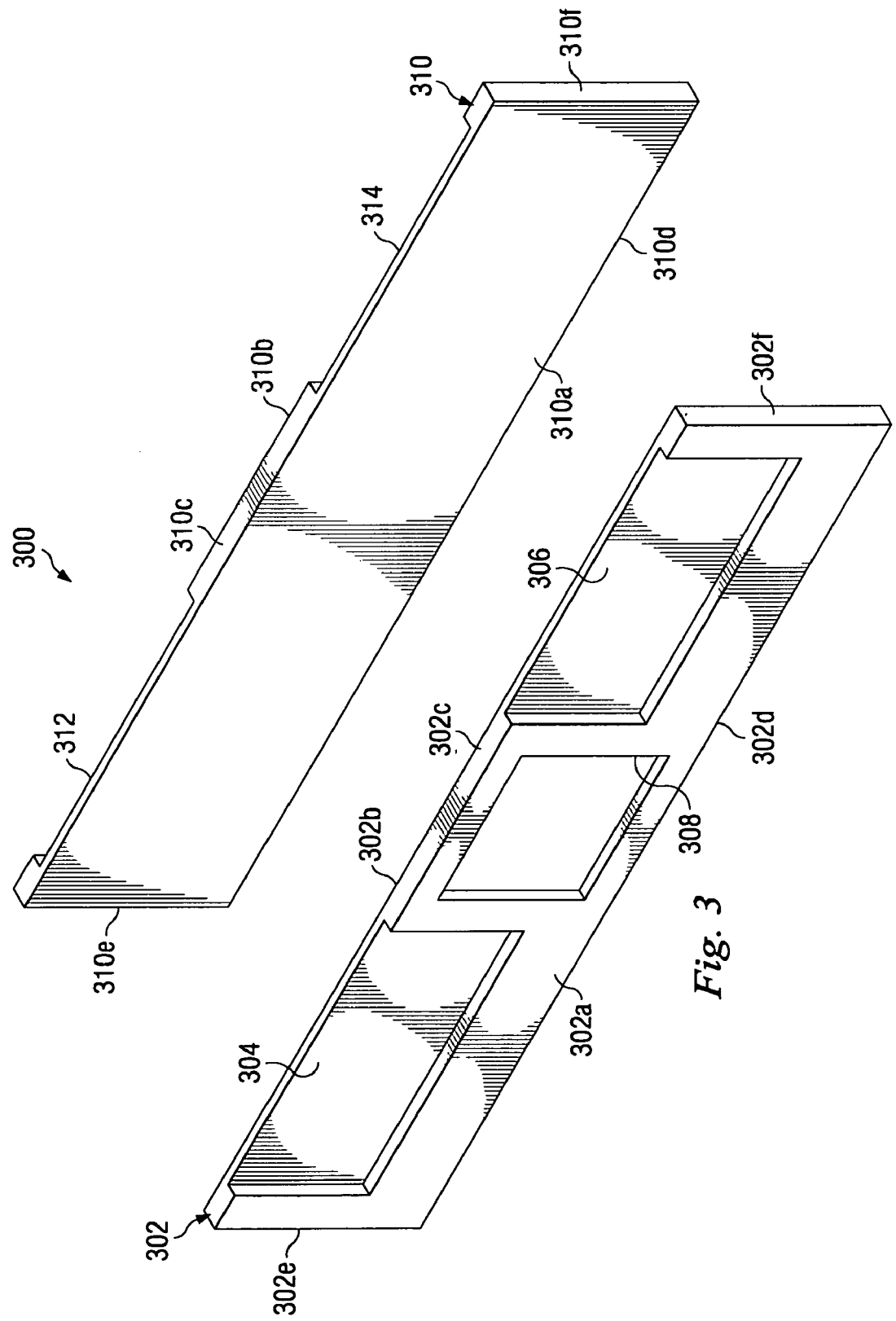
FIG. 3 is a perspective view illustrating an embodiment of a first heat sink used with the memory device of FIG. 2.

Referring now to FIG. 3, a first heat sink 300 is illustrated. The first heat sink 300 includes a first base member 302 having a front surface 302a, a rear surface 302b located opposite the front surface 302a, a top edge 302c extending between the front surface 302a and the rear surface 302b, a bottom edge 302d located opposite the top edge 302c and extending between the front surface 302a and the rear surface 302b, and a pair of opposing side edges 302e and 302f extending between the front surface 302a, the rear surface 302b, the top edge 302c, and the bottom edge 302d. A first retaining member channel 304 is defined by the first base member 302, extends into the front surface 302a and the top edge 302c, and is located adjacent the side edge 302e. A first retaining member channel 306 is defined by the first base member 302, extends into the front surface 302a and the top edge 302c, and is located adjacent the side edge 302f. A second heat sink aperture 308 is defined by the first base member 302, is substantially centrally located on the first base member 302, and extends through the first base member 302 from the front surface 302a to the rear surface 302b. The first heat sink 300 also includes a second base member 310 having a front surface 310a, a rear surface 310b located opposite the front surface 310a, a top edge 310c extending between the front surface 310a and the rear surface 310b, a bottom edge 310d located opposite the top edge 310c and extending between the front surface 310a and the rear surface 310b, and a pair of opposing side edges 310e and 310f extending between the front surface 310a, the rear surface 310b, the top edge 310c, and the bottom edge 310d. A first retaining member channel 312 is defined by the second base member 310, extends into the rear surface 310b and the top edge 310c, and is located adjacent the side edge 310e. A first retaining member channel 314 is defined by the second base member 310, extends into the front surface 310a and the top edge 310c, and is located adjacent the side edge 310f. In an embodiment, the first heat sink 300 may be fabricated from copper, graphite, aluminum, and/or a variety of other heat sink materials known in the art. In an embodiment, the first heat sink 300 may include vapor chambers, heat pipes, and/or a variety of other heat dissipation components known in the art. In an embodiment, the first base member 302 and the second base member 310 may include heat dissipation components such as, for example, fins, heat pipes, and/or a variety of other heat dissipation components known in the art.

Referring now to FIG. 4, a second heat sink 400 is illustrated. The second heat sink 400 includes a base 402 having a front surface 402a, a rear surface 402b located opposite the front surface 402a, a top edge 402c extending between the front surface 402a and the rear surface 402b, a bottom edge 402d located opposite the top edge 402c and extending between the front surface 402a and the rear surface 402b, and a pair of opposing side edges 402e and 402f extending between the front surface 402a, the rear surface 402b, the top edge 402c, and the bottom edge 402d. A plurality of heat fins 404 extend from the front surface 402a of the base 402. In an embodiment, the second heat sink 400 may be fabricated from copper, graphite, aluminum, and/or a variety of other heat sink materials known in the art. In an embodiment, the second heat sink 400 may include vapor chambers, heat pipes, and/or a variety of other heat dissipation components known in the art.

Referring now to FIG. 5, a first retaining member 500 is illustrated. The first retaining member 500 includes a substantially U-shaped base 502 having a front wall 502a and a rear wall 502b which are held in a spaced apart orientation by a top wall 502c. The front wall 502a includes a bottom edge 502aa located opposite the top wall 502c. The rear wall 502b includes a bottom edge 502ba located opposite the top wall 502c. A first channel 504 is defined by the front wall 502a, the rear wall 502b, and the top wall 502c of the base 502 and is located substantially centrally on the base 502. A retaining passageway 506 is defined between the front wall 502a, the rear wall 502b, and the top wall 502c of the base 502. In an embodiment, the front wall 502a and the rear wall 502b are oriented with respect to each other such that the width of the top wall 502c is greater than the distance between the bottom edge 502aa of the front wall 502a and the bottom edge 502ba of the rear wall 502b.

Figure 6B:
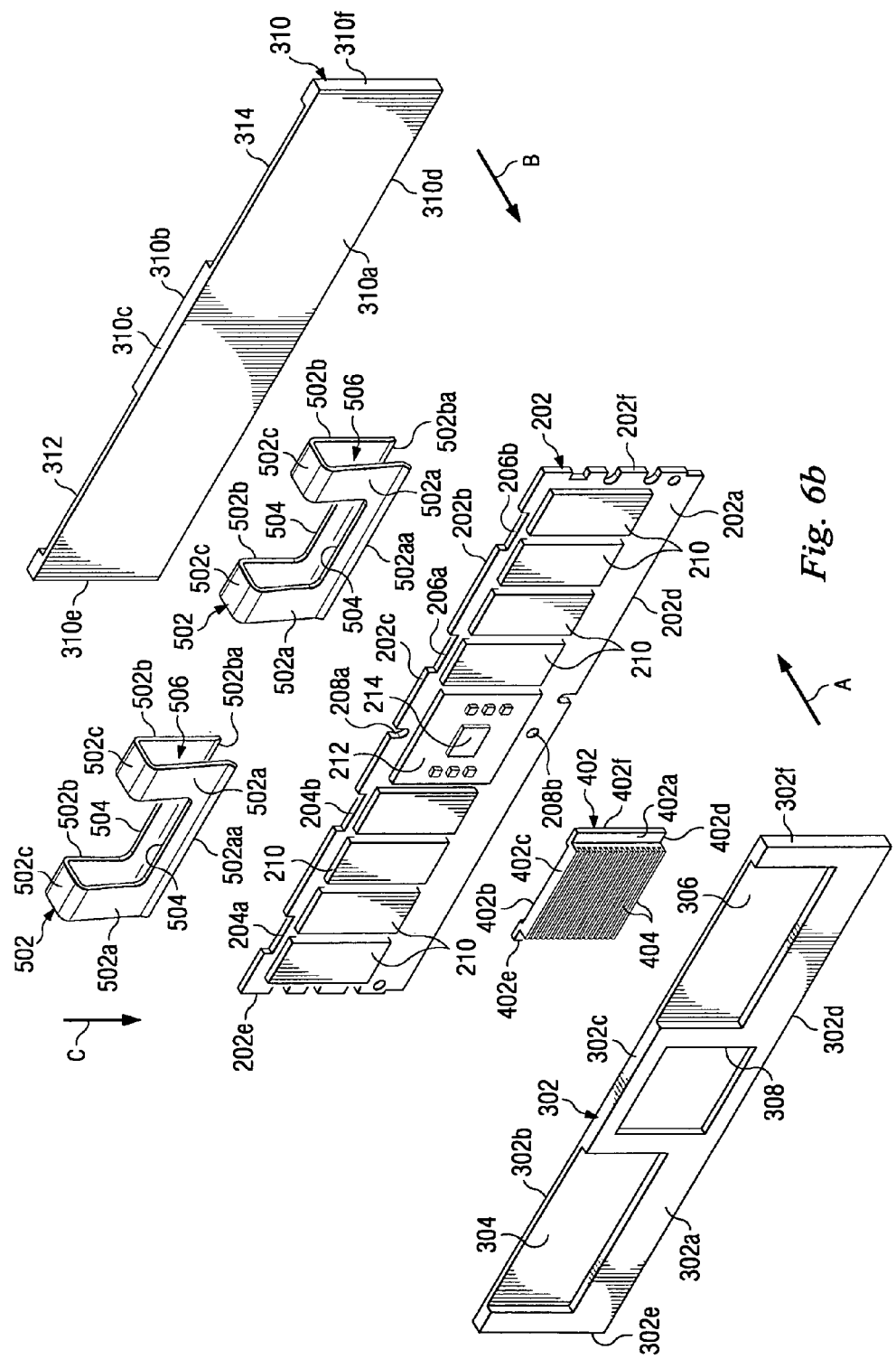
FIG. 6b is an exploded perspective view illustrating an embodiment of the assembly of the memory device of FIG. 2, the first heat sink of FIG. 3, the second heat sink of FIG. 4, and the retaining member of FIG. 5.
Figure 6C:
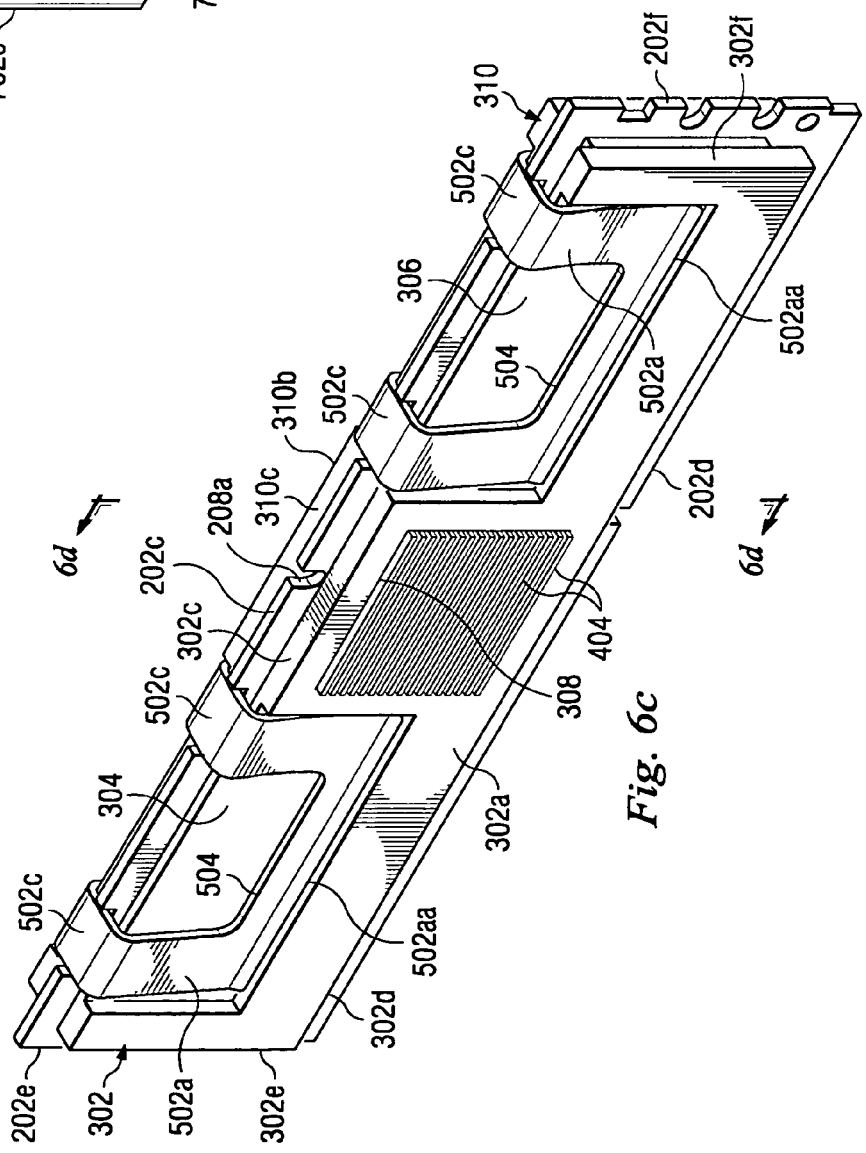
FIG. 6c is a perspective view illustrating an embodiment of a memory device cooling apparatus including the first heat sink of FIG. 3, the second heat sink of FIG. 4, and the retaining member of FIG. 5 coupled to the memory device of FIG. 2.
Figure 6D:
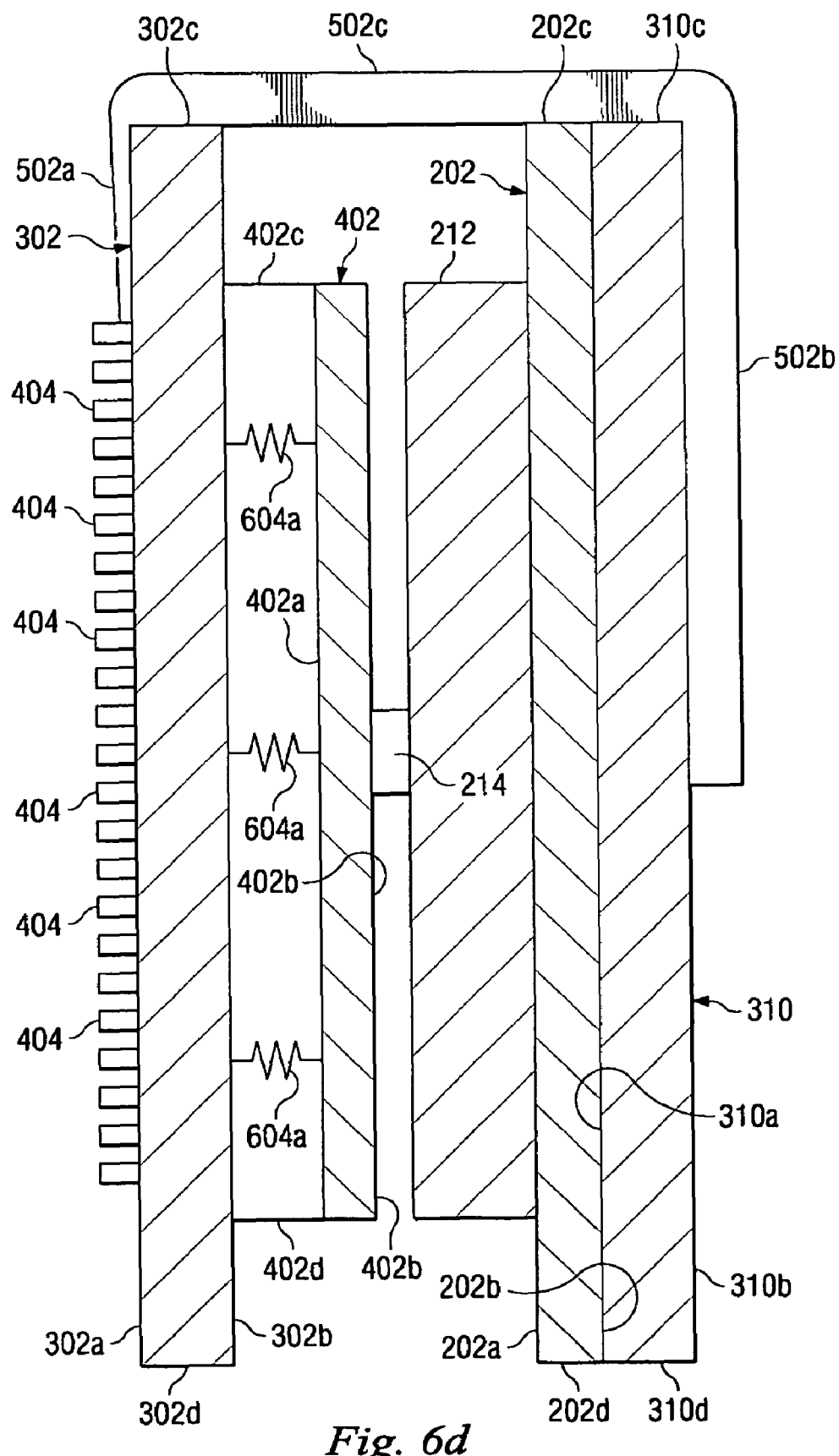
FIG. 6d is a cross sectional view illustrating an embodiment of the memory device cooling apparatus of FIG. 6c coupled to the memory device.

Referring now to FIGS. 6a, 6b, 6c and 6d, a method 600 for cooling a memory device is illustrated. The method 600 begins at step 602 where the memory device 200, described above with reference to FIG. 2, is provided. The method 600 then proceeds to step 604 where the first chips 210 on the memory device 200 are engaged with the first heat sink 300, described above with reference to FIG. 3, and the second chip 212 on the memory device 200 is engaged with the second heat sink 400, described above with reference to FIG. 4. The second heat sink 400 is positioned adjacent the memory device 200 such that the rear surface 402b of the second heat sink 400 is located adjacent the heat transfer member 214 on the second chip 212, as illustrated in FIG. 6b. The first base member 302 of the first heat sink 300 is positioned adjacent the memory device 200 such that the rear surface 302b of the first base member 302 is located adjacent the first chips 210 with the second heat sink 400 located between the first base member 302 and the memory device 200 and the second heat sink aperture 308 defined by the first base member 302 located adjacent the second heat sink 400, as illustrated in FIG. 6b. The second base member 310 is positioned adjacent the memory device 200 such that the front surface 310a of the second base member 310 is located adjacent the rear surface 202b of the memory device 200, as illustrated in FIG. 6b. The first base member 302 of the first heat sink 300 and the second heat sink 400 are then each moved in a direction A towards the memory device 200 such that the rear surface 302b of the first base member 302 engages the first chips 210, the rear surface 402b on the second heat sink 402 engages the heat transfer member 214 on the second chip 212, and the heat fins 404 on the second heat sink 400 extend through the second heat sink aperture 308, as illustrated in FIGS. 6c and 6d. In an embodiment, a resilient member 604a engages the rear surface 302b of the first base member 302 on the first heat sink 300 and the front surface 402a on the second heat sink 400 such that the second heat sink 400 is moveably coupled to the first heat sink 300, as illustrated in FIG. 6d. In an embodiment, the resilient member 604a is a leaf spring that is coupled to the front surface 402a of the second heat sink 400. The second base member 310 of the first heat sink 310 is moved in a direction B towards the memory device 200 such that the front surface 310a of the second base member 310 engages the rear surface 202b of the memory device 200, as illustrated in FIGS. 6c and 6d. In an embodiment, the front surface 310a of the second base member 310 engages a plurality of first chips 210 (not shown) located on the rear surface 202b of the memory device 200.

The method 600 then proceeds to step 606 where the first heat sink 300 and the second heat sink 400 are coupled to the memory device 200 with a retaining device. In an embodiment, a retaining device includes a plurality of the first retaining members 500, described above with reference to FIG. 5. The first retaining members 500 are positioned adjacent the memory device 200 and the first heat sink 300 and second heat sink 400 such that one first retaining member 500 is located adjacent the first retaining member channels 304 and 312 defined by the first base member 302 and the second base member 310, respectively, and another first retaining member 500 is located adjacent the first retaining member channels 306 and 314 defined by the first base member 302 and the second base member 310, respectively. The first retaining members 500 are then moved in a direction C such that the memory device 200, the first base member 302 of the first heat sink 300, and the second base member 310 of the first heat sink 300 are located in the retaining passageway 506 defined by the first retaining members 500. With the memory device 200, the first base member 302 of the first heat sink 300, and the second base member 310 of the first heat sink 300 located in the retaining passageway 506 defined by the first retaining members 500, the front wall 502a of one retaining member 500 is located in the first retaining member channel 304 defined by the first base member 302, the rear wall 502b of that first retaining member 500 is located in the first retaining member channel 312 defined by the second base member 310, and the top wall 502c of that first retaining member 500 is located in the first retaining member channels 204a and 204b defined by the memory device 200, as illustrated in FIG. 6c. With the memory device 200, the first base member 302 of the first heat sink 300, and the second base member 310 of the first heat sink 300 located in the retaining passageway 506 defined by the first retaining members 500, the front wall 502a of one retaining member 500 is located in the first retaining member channel 306 defined by the first base member 302, the rear wall 502b of that first retaining member 500 is located in the first retaining member channel 314 defined by the second base member 310, and the top wall 502c of that first retaining member 500 is located in the first retaining member channels 206a and 206b defined by the memory device 200, as illustrated in FIG. 6c. With the first retaining member 500 coupling the first heat sink 300 and the second heat sink 400 to the memory device 200, the stiffness of the memory device 200 is increased.

The method 600 then proceeds to step 608 where the memory device 200 is cooled. The memory device 200 with the first heat sink 300 and the second heat sink 400 coupled to it may be coupled to a processor such as, for example, the processor 102, described above with reference to FIG. 1, using methods known in the art for use with an IHS such as, for example, the IHS 100, described above with reference to FIG. 1. During operation of the memory device 200, the first chips 210 will operate at a first temperature and the second chip 212 will operate at a second temperature that is different from the first temperature. The first heat sink 300 will dissipate heat from the first chips 210 and the second heat sink 400 will dissipate heat from the second chip 212. Due to the weak thermal coupling between the first heat sink 300 and the second heat sink 400, the dissipation of heat from the first chips 210 and the second chip 212 is more efficient than conventional memory device cooling apparatus as heat from the first chips 210 does not effect the second heat sink 400 and heat from the second chip 212 does not effect the first heat sink 300. Thus, a method and apparatus are provided which allow efficient thermal dissipation for a memory device having a first chip and a second chip that operate at different temperatures.

Figure 7A:
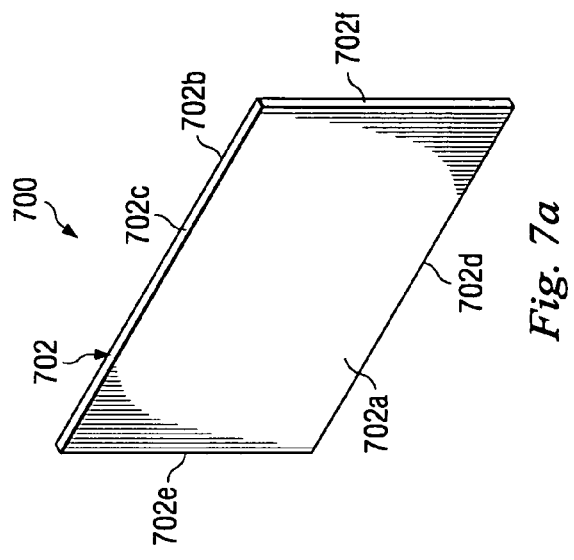
FIG. 7a is a perspective view illustrating an alternative embodiment of a component of a first heat sink used with the memory device of FIG. 2.
Figure 7B:
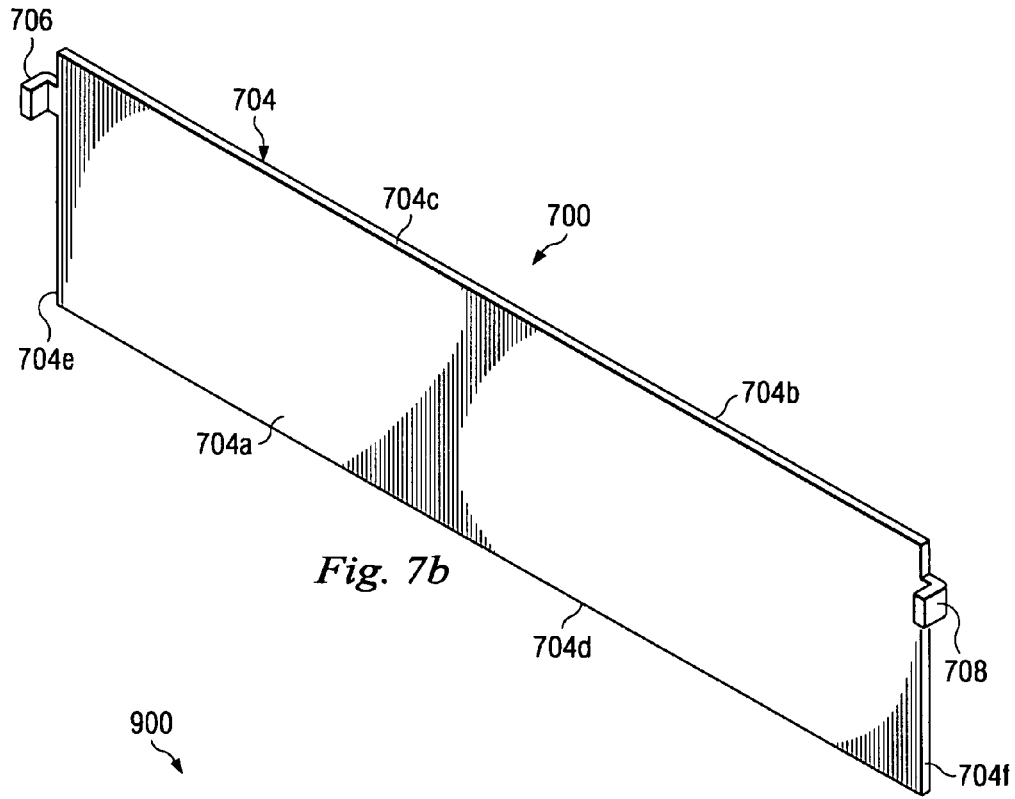
FIG. 7b is a perspective view illustrating an alternative embodiment of a component of a first heat sink used with the memory device of FIG. 2.

Referring now to FIGS. 7a and 7b, an alternative embodiment of a first heat sink 700 is illustrated. The first heat sink 700 includes a first base member 702 having a front surface 702a, a rear surface 702b located opposite the front surface 702a, a top edge 702c extending between the front surface 702a and the rear surface 702b, a bottom edge 702d located opposite the top edge 702c and extending between the front surface 702a and the rear surface 702b, and a pair of opposing side edges 702e and 702f extending between the front surface 702a, the rear surface 702b, the top edge 702c, and the bottom edge 702d. The first heat sink 700 also includes a second base member 704 having a front surface 704a, a rear surface 704b located opposite the front surface 704a, a top edge 704c extending between the front surface 704a and the rear surface 704b, a bottom edge 704d located opposite the top edge 704c and extending between the front surface 704a and the rear surface 704b, and a pair of opposing side edges 704e and 704f extending between the front surface 704a, the rear surface 704b, the top edge 704c, and the bottom edge 704d. A coupling member 706 extends from the side edge 704e of the second base member 704 and out past the front surface 704a of the second base member 704. A coupling member 708 extends from the side edge 704f of the second base member 704 and out past the front surface 704a of the second base member 704. In an embodiment, the first base member 702 and the second base member 704 may be fabricated from copper, graphite, aluminum, and/or a variety of other heat sink materials known in the art. In an embodiment, the first base member 702 and the second base member 704 may include vapor chambers, heat pipes, and/or a variety of other heat dissipation components known in the art. In an embodiment, the first base member 702 and the second base member 704 may include heat dissipation components such as, for example, fins, heat pipes, and/or a variety of other heat dissipation components known in the art.

Figure 8:
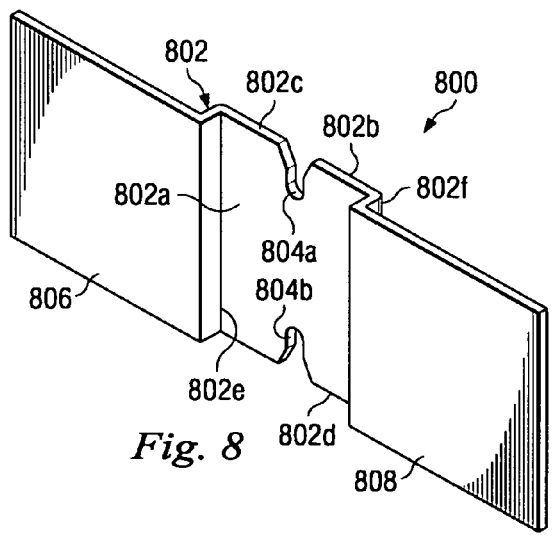
FIG. 8 is a perspective view illustrating an alternative embodiment of a second heat sink used with the memory device of FIG. 2 and the first heat sink of FIGS. 7a and 7b.

Referring now to FIG. 8, an alternative embodiment of a second heat sink 800 is illustrated. The second heat sink 800 includes a base 802 having a front surface 802a, a rear surface 802b located opposite the front surface 802a, a top edge 802c extending between the front surface 802a and the rear surface 802b, a bottom edge 802d located opposite the top edge 802c and extending between the front surface 802a and the rear surface 802b, and a pair of opposing side edges 802e and 802f extending between the front surface 802a, the rear surface 802b, the top edge 802c, and the bottom edge 802d. A second retaining member channel 804a is defined by the base 802, extends through the base from the front surface 802a to the rear surface 802b and down from the top edge 802c, and is substantially centrally located on the top edge 802c of the base 802. A second retaining member channel 804b is defined by the base 802, extends through the base from the front surface 802a to the rear surface 802b and up from the bottom edge 802d, and is substantially centrally located on the bottom edge 802d of the base 802. A heat dissipation wall 806 extends from the side edge 802e of the base 802. A heat dissipation wall 808 extends from the side edge 802f of the base 802. In an embodiment, the second heat sink 800 may be fabricated from copper, graphite, aluminum, and/or a variety of other heat sink materials known in the art. In an embodiment, the second heat sink 800 may include vapor chambers, heat pipes, and/or a variety of other heat dissipation components known in the art. In an embodiment, the base 802 may include heat dissipation components such as, for example, fins, heat pipes, and/or a variety of other heat dissipation components known in the art.

Figure 9A:
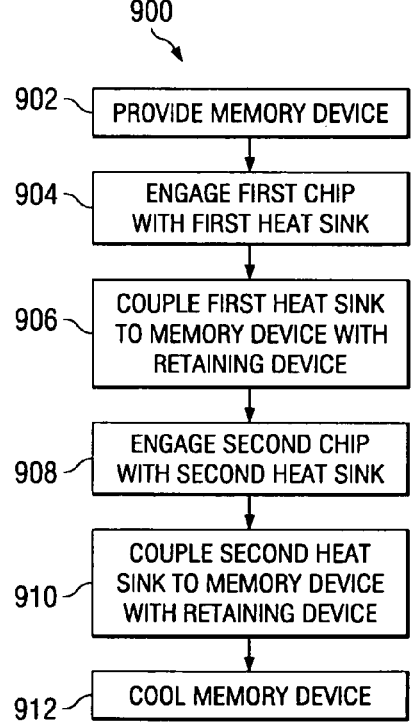
FIG. 9a is a flow chart illustrating an embodiment of method for cooling a memory device.
Figure 9B:
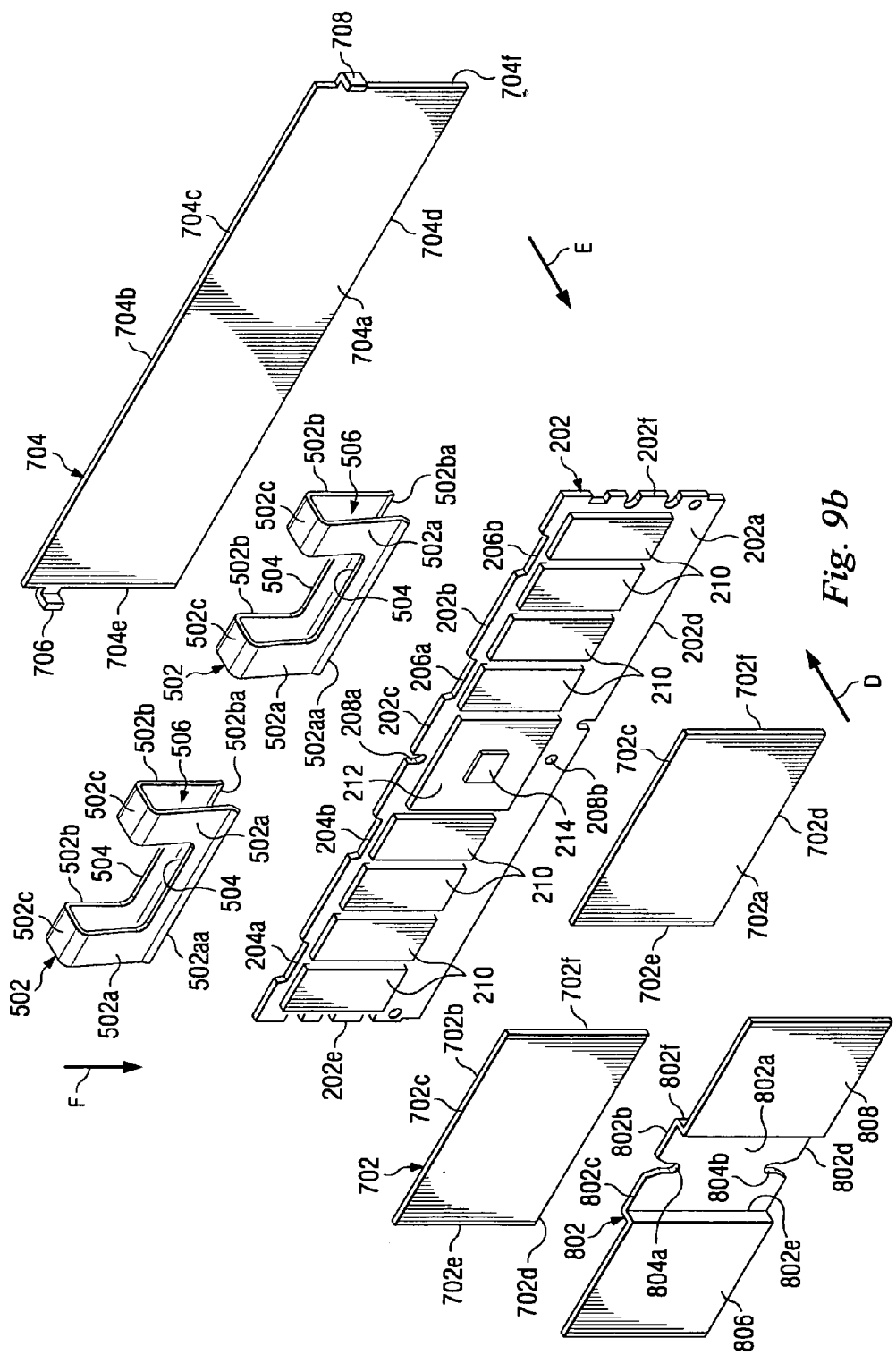
FIG. 9b is an exploded perspective view illustrating an embodiment of the assembly of the memory device of FIG. 2, the first heat sink of FIGS. 7a and 7b, the second heat sink of FIG. 8, and the retaining member of FIG. 5.

Referring now to FIGS. 9a, 9b and 9c, a method 900 for cooling a memory device is illustrated. The method 900 begins at step 902 where the memory device 200, described above with reference to FIG. 2, is provided. The method 900 then proceeds to step 904 where the first chips 210 on the memory device 200 are engaged with the first heat sink 700, described above with reference to FIGS. 7a and 7b. A plurality of the first base members 702 of the first heat sink 300 are positioned adjacent the memory device 200 such that the rear surfaces 702b of the first base members 702 are adjacent the first chips 210, as illustrated in FIG. 6b. The second base member 704 is positioned adjacent the memory device 200 such that the front surface 704a of the second base member 704 is located adjacent the rear surface 202b of the memory device 200, as illustrated in FIG. 6b. The first base members 702 of the first heat sink 700 are then each moved in a direction D towards the memory device 200 such that the rear surface 702b of the first base members 702 engage the first chips 210, as illustrated in FIGS. 6c and 6d. The second base member 704 of the first heat sink 700 is moved in a direction E towards the memory device 200 such that the front surface 704a of the second base member 704 engages the rear surface 202b of the memory device 200, as illustrated in FIGS. 6c and 6d. In an embodiment, the front surface 704a of the second base member 704 engages a plurality of first chips 210 (not shown) located on the rear surface 202b of the memory device 200.

The method 900 then proceeds to step 906 where the first heat sink 700 is coupled to the memory device 200 with a retaining device. In an embodiment, a retaining device includes a plurality of the first retaining members 500, described above with reference to FIG. 5. The first retaining members 500 are positioned adjacent the memory device 200 and the first heat sink 700 such that they are located adjacent the first base member 702 and the second base member 704. The first retaining members 500 are then moved in a direction F such that the memory device 200, the first base member 702 of the first heat sink 700, and the second base member 704 of the first heat sink 700 are located in the retaining passageway 506 defined by the first retaining members 500. With the memory device 200, the first base member 702 of the first heat sink 700, and the second base member 704 of the first heat sink 700 located in the retaining passageway 506 defined by the first retaining members 500, the front wall 502a of one retaining member 500 engages the first base member 702, the rear wall 502b of that first retaining member 500 engages the second base member 7004, and the top wall 502c of that first retaining member 500 is located in the first retaining member channels 204a and 204b defined by the memory device 200, as illustrated in FIG. 9c. With the memory device 200, the first base member 702 of the first heat sink 700, and the second base member 704 of the first heat sink 700 located in the retaining passageway 506 defined by the first retaining members 500, the front wall 502a of one retaining member 500 engages the first base member 702, the rear wall 502b of that first retaining member 500 engages the second base member 704, and the top wall 502c of that first retaining member 500 located in the first retaining member channels 206a and 206b defined by the memory device 200, as illustrated in FIG. 9c.

The method 900 then proceeds to step 908 where the second chip 212 on the memory device 200 is engaged with the second heat sink 800, described above with reference to FIG. 8. The second heat sink 800 is positioned adjacent the memory device 200 such that the rear surface 802b of the second heat sink 800 is located adjacent the heat transfer member 214 on the second chip 212, as illustrated in FIG. 9b. The second heat sink 800 is then moved in the direction D such that the rear surface 802b of the second heat sink 800 engages the heat transfer member 214 on the second chip 212. The method 900 then proceeds to step 910 where the second heat sink 800 is coupled to the memory device 200 with a retaining device. In an embodiment, a retaining device includes a second retaining member 910a. The second retaining member 910a is coupled to the memory device 200 and the second heat sink 800 by engaging the second retaining member channel 208a and the second retaining member aperture 208b defined by the memory device 200, and engaging the second retaining member channels 804a and 804b and the front surface 802a of the second heat sink 800 with second retaining member 910a, as illustrated in FIG. 9c.

The method 900 then proceeds to step 912 where the memory device 200 is cooled. The memory device 200 with the first heat sink 700 and the second heat sink 800 coupled to it may be coupled to a processor such as, for example, the processor 102, described above with reference to FIG. 1, using methods known in the art for use with an IHS such as, for example, the IHS 100, described above with reference to FIG. 1. During operation of the memory device 200, the first chips 210 will operate at a first temperature and the second chip 212 will operate at a second temperature that is different from the first temperature. The first heat sink 700 will dissipate heat from the first chips 210 and the second heat sink 800 will dissipate heat from the second chip 212. Due to the weak thermal coupling between the first heat sink 700 and the second heat sink 800, the dissipation of heat from the first chips 210 and the second chip 212 is more efficient than conventional memory device cooling apparatus as heat from the first chips 210 does not effect the second heat sink 800 and heat from the second chip 212 does not effect the first heat sink 700. Thus, a method and apparatus are provided which allow efficient thermal dissipation for a memory device having a first chip and a second chip that operate at different temperatures.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A memory device cooling apparatus, comprising:
    a first heat sink operable to engage a first chip that is located on a memory device and that is operable to operate at a first temperature;
    a second heat sink that is separate from the first heat sink and is operable to engage a second chip that is located on a memory device and that is operable to operate at a second temperature, wherein the second temperature is different from the first temperature; and
    a retaining feature operable to couple the first heat sink and the second heat sink to a memory device, wherein the second heat sink is moveably coupled to the first heat sink.

2. The apparatus of claim 1, wherein the first heat sink is operable to engage a Dynamic Random Access Memory (DRAM) chip.

3. The apparatus of claim 1, wherein the second heat sink is operable to engage a Advanced Memory Buffer (AMB) chip.

4. The apparatus of claim 1, further comprising:
    a resilient member moveably coupling the second heat sink to the first heat sink.

5. The apparatus of claim 1, wherein the first heat sink defines a second heat sink aperture, whereby the second heat sink is operable to be positioned in the second heat sink aperture.

6. The apparatus of claim 1, wherein the second heat sink is coupled to the first heat sink such that the first retaining member engaging the first heat sink also secures the second heat sink to the memory device.

7. The apparatus of claim 1, wherein the retaining device comprises a second retaining member that engages the second heat sink to secure the second heat sink to the memory device.

8. An information handling system, comprising:
    a processor;
    a memory device electrically coupled to the processor;
    a first chip located on the memory device that is operable to operate at a first temperature;
    a second chip located on the memory device that is operable to operate at a second temperature, wherein the second temperature is different from the first temperature;
    a first heat sink engaging the first chip; and
    a second heat sink engaging the second chip, wherein the second heat sink is separate from the first heat sink, and wherein the second heat sink is moveably coupled to the first heat sink.

9. The system of claim 8, wherein the first chip is a DRAM chip.

10. The system of claim 8, wherein the second chip is a AMB chip.

11. The system of claim 8, further comprising:
    a resilient member moveably coupling the second heat sink to the first heat sink.

12. The system of claim 8, wherein the first heat sink defines a second heat sink aperture, whereby the second heat sink is positioned in the second heat sink aperture.

13. The system of claim 8, further comprising:
    a retaining device comprising a first retaining member that engages the first heat sink to secure the first heat sink to the memory device.

14. The system of claim 13, wherein the second heat sink is coupled to the first heat sink such that the first retaining member engaging the first heat sink also secures the second heat sink to the memory device.

15. The system of claim 13, wherein the retaining device comprises a second retaining member that engages the second heat sink to secure the second heat sink to the memory device.

16. A method for cooling a memory device in an information handling system (IHS) comprising:
    providing a processor in an IHS chassis;
    electrically coupling a memory device to the processor;
    providing a first chip on the memory device that is operable to function at a first temperature;
    providing a second chip in the memory device that is operable to function at a second temperature, different from the first temperature;
    engaging a first heat sink with the first chip; and engaging a second heat sink with the second chip, wherein the second heat sink is separate from the first heat sink, and where in the second heat sink is removably coupled to the first heat sink.

* * * * *

UNITED STATES PATENT AND TRADEMARK OFFICE
CERTIFICATE OF CORRECTION

PATENT NO.        : 7,400,506 B2                                              Page 1 of 1
APPLICATION NO. : 11/484458
DATED             : July 15, 2008
INVENTOR(S)       : Shawn P. Hoss et al.

It is certified that error appears in the above-identified patent and that said Letters Patent is hereby corrected as shown below:

Claim 16, Column 10, Lines 55-56; after temperature; insert the following --and--.

Signed and Sealed this

Tenth Day of March, 2009

JOHN DOLL
*Acting Director of the United States Patent and Trademark Office*